US012564001B2

(12) United States Patent
Ye et al.

(10) Patent No.: US 12,564,001 B2
(45) Date of Patent: Feb. 24, 2026

(54) DUAL PYROMETER SYSTEMS FOR SUBSTRATE TEMPERATURE CONTROL DURING FILM DEPOSITION

(71) Applicant: ASM IP Holding B.V., Almere (NL)

(72) Inventors: Han Ye, Phoenix, AZ (US); Kai Zhou, Phoenix, AZ (US); Peipei Gao, Tempe, AZ (US); Wentao Wang, Phoenix, AZ (US); Kishor Patil, Chandler, AZ (US); Fan Gao, Tempe, AZ (US); Krishnaswamy Mahadevan, Phoenix, AZ (US); Xing Lin, Chandler, AZ (US); Alexandros Demos, Scottsdale, AZ (US); Yanfu Lu, Phoenix, AZ (US); Amir Kajbafvala, Chandler, AZ (US)

(73) Assignee: ASM IP Holding B.V., Almere (NL)

( * ) Notice: Subject to any disclaimer, the term of this patent is extended or adjusted under 35 U.S.C. 154(b) by 712 days.

(21) Appl. No.: 17/697,145

(22) Filed: Mar. 17, 2022

(65) Prior Publication Data

US 2022/0301905 A1 Sep. 22, 2022

Related U.S. Application Data

(60) Provisional application No. 63/270,673, filed on Oct. 22, 2021, provisional application No. 63/162,878, filed on Mar. 18, 2021.

(51) Int. Cl.
*C23C 16/46* (2006.01)
*C23C 16/52* (2006.01)
(Continued)

(52) U.S. Cl.
CPC ........ *H01L 21/67248* (2013.01); *C23C 16/46* (2013.01); *C23C 16/52* (2013.01);
(Continued)

(58) Field of Classification Search
CPC ......... H01L 21/67115; H01L 21/67248; H01L 22/20; H01L 21/00; H01L 21/02;
(Continued)

(56) References Cited

U.S. PATENT DOCUMENTS 5,155,336 A 10/1992 Gronet
5,231,595 A 7/1993 Makino et al.
(Continued)

FOREIGN PATENT DOCUMENTS

CN 106637145 A 5/2017
JP H06104252 A 4/1994
(Continued)

OTHER PUBLICATIONS

Wessapan, Teerapot, et al., "Temperature induced in human organs due to near-field and far-field electromagnetic exposure effects". International Journal of Heat and Mass Transfer 119 (2018) 65-76.
(Continued)

*Primary Examiner* — Monica D Harrison
(74) *Attorney, Agent, or Firm* — Snell & Wilmer L.L.P.

(57) ABSTRACT

A method of operating a reactor system to provide multi-zone substrate temperature control. The method includes, with a first pyrometer, sensing a temperature of a first zone of a substrate supported in the reactor system, and, with a second pyrometer, sensing a temperature of a second zone of the substrate. The method further includes, with a controller, comparing the temperatures of the first and second zones to setpoint temperatures for the first and second zones and, in response, generating control signals to control heating of the substrate. The method also includes controlling, based on the control signals, operations of a heater assembly operating to heat the substrate.

14 Claims, 9 Drawing Sheets

(51) Int. Cl.
    *G01J 5/48*         (2022.01)
    *H01L 21/66*      (2006.01)
    *H01L 21/67*      (2006.01)

(52) U.S. Cl.
    CPC ........ *H01L 21/67115* (2013.01); *H01L 22/20*
                  (2013.01); *G01J 5/48* (2013.01)

(58) Field of Classification Search
    CPC ......... H01L 21/02002; H01L 21/02008; H01L
                 21/02005; H01L 21/64; G01J 5/48; G01J
                 5/0007; G01J 5/485; G01J 5/00; C23C
                               16/46; C23C 16/52
    USPC .......................................................... 438/5
    See application file for complete search history.

(56)              References Cited

U.S. PATENT DOCUMENTS

| | | | |
|---|---|---|---|
| 5,305,417 | A | 4/1994 | Najm et al. |
| 6,065,481 | A | 5/2000 | Fayfield et al. |
| 6,079,874 | A | 6/2000 | Hegedus |
| 6,092,539 | A | 7/2000 | Chang et al. |
| 6,277,204 | B1 | 8/2001 | Chang et al. |
| 6,348,420 | B1 * | 2/2002 | Raaijmakers ........ H10D 64/685 |
| | | | 438/770 |
| 6,492,625 | B1 | 12/2002 | Boguslavskiy et al. |
| 6,536,964 | B1 | 3/2003 | Kitano et al. |
| 6,596,973 | B1 | 7/2003 | Donald et al. |
| 6,640,604 | B2 | 11/2003 | Matsushita |
| 6,799,137 | B2 | 9/2004 | Schietinger et al. |
| 7,198,997 | B2 | 4/2007 | Shiono et al. |
| 7,651,956 | B1 | 1/2010 | Mercaldi et al. |
| 7,921,802 | B2 | 4/2011 | De |
| 7,964,038 | B2 | 6/2011 | Patalay et al. |
| 8,895,395 | B1 | 11/2014 | Kerber et al. |
| 8,969,934 | B1 | 3/2015 | Cheng et al. |
| 9,034,770 | B2 | 5/2015 | Park et al. |
| 9,093,269 | B2 | 7/2015 | Cody et al. |
| 9,093,390 | B2 | 7/2015 | Wang et al. |
| 9,299,557 | B2 | 3/2016 | Tolle et al. |
| 9,474,163 | B2 | 10/2016 | Tolle et al. |
| 9,512,520 | B2 | 12/2016 | Sanchez et al. |
| 9,514,927 | B2 | 12/2016 | Tolle et al. |
| 9,570,298 | B1 | 2/2017 | Basker et al. |
| 9,576,788 | B2 | 2/2017 | Liu et al. |
| 9,683,308 | B2 | 6/2017 | Olsen et al. |
| 9,757,878 | B2 | 9/2017 | Feuilloley et al. |
| 9,870,921 | B2 | 1/2018 | Olsen et al. |
| 9,887,096 | B2 | 2/2018 | Park et al. |
| 9,905,420 | B2 | 2/2018 | Margetis et al. |
| 10,373,850 | B2 | 8/2019 | Tolle et al. |
| 10,519,541 | B2 | 12/2019 | Tolle et al. |
| 10,566,187 | B2 | 2/2020 | Qian et al. |
| 10,861,693 | B2 | 12/2020 | Stone et al. |
| 11,227,959 | B2 | 1/2022 | Siegmund et al. |
| 2002/0062845 | A1 | 5/2002 | Kawai et al. |
| 2003/0119283 | A1 | 6/2003 | Ishibashi et al. |
| 2007/0015360 | A1 | 1/2007 | Lu et al. |
| 2007/0212510 | A1 | 9/2007 | Hieslmair et al. |
| 2008/0090193 | A1 | 4/2008 | Soanes |
| 2009/0101633 | A1 | 4/2009 | Aggarwal et al. |
| 2010/0133257 | A1 | 6/2010 | Sorabji et al. |
| 2011/0149062 | A1 | 6/2011 | Campidell et al. |
| 2011/0205688 | A1 | 8/2011 | Ray et al. |
| 2011/0266252 | A1 | 11/2011 | Thadani et al. |
| 2011/0299898 | A1 | 12/2011 | Ito et al. |
| 2012/0160828 | A1 | 6/2012 | Bowman et al. |
| 2012/0237695 | A1 | 9/2012 | Pye et al. |
| 2012/0270384 | A1 | 10/2012 | Sanchez et al. |
| 2013/0052333 | A1 | 2/2013 | Lindow et al. |
| 2013/0171350 | A1 | 7/2013 | Kraus et al. |
| 2015/0184313 | A1 | 7/2015 | Yoshitake et al. |
| 2015/0217517 | A1 | 8/2015 | Karpas et al. |
| 2015/0330837 | A1 | 11/2015 | Liberti et al. |
| 2016/0027671 | A1 | 1/2016 | Ranish et al. |
| 2016/0027674 | A1 | 1/2016 | Griffin et al. |
| 2016/0068955 | A1 | 3/2016 | Brillhart et al. |
| 2016/0133504 | A1 | 5/2016 | Chu |
| 2016/0307771 | A1 | 10/2016 | Xu et al. |
| 2017/0074727 | A1 | 3/2017 | Liu et al. |
| 2017/0074737 | A1 | 3/2017 | Hamabe et al. |
| 2017/0101712 | A1 | 4/2017 | Bansal et al. |
| 2017/0178917 | A1 | 6/2017 | Kamp et al. |
| 2017/0194430 | A1 | 7/2017 | Wood et al. |
| 2017/0278761 | A1 | 9/2017 | Devilliers |
| 2018/0182597 | A1 | 6/2018 | Blomberg et al. |
| 2018/0195174 | A1 | 7/2018 | Kim et al. |
| 2019/0027605 | A1 | 1/2019 | Tolle et al. |
| 2019/0112709 | A1 | 4/2019 | Arkles et al. |
| 2019/0123174 | A1 | 4/2019 | Mochizuki et al. |
| 2019/0127851 | A1 * | 5/2019 | Lau .................... B23K 26/0604 |
| 2019/0185990 | A1 | 6/2019 | Zhao |
| 2019/0333793 | A1 | 10/2019 | Tolle et al. |
| 2020/0115800 | A1 | 4/2020 | Ohkawa |
| 2020/0118336 | A1 | 4/2020 | Oyanagi et al. |
| 2020/0118836 | A1 | 4/2020 | Ding et al. |
| 2020/0203149 | A1 | 6/2020 | Huang et al. |
| 2020/0294794 | A1 | 9/2020 | Haberecht et al. |
| 2021/0125853 | A1 | 4/2021 | Rathi et al. |
| 2021/0257260 | A1 | 8/2021 | Chu et al. |
| 2021/0366722 | A1 | 11/2021 | Lei et al. |
| 2022/0298643 | A1 | 9/2022 | Kajbafvala et al. |
| 2022/0386417 | A1 | 12/2022 | Taniguchi |

FOREIGN PATENT DOCUMENTS

| | | |
|---|---|---|
| JP | 2010062197 A | 3/2010 |
| KR | 20140105974 A | 9/2014 |
| TW | 201415541 A | 4/2014 |
| WO | 2013192510 A1 | 12/2013 |

OTHER PUBLICATIONS

Brar, Victor W., et al., "Electronic modulation of infrared radiation in graphene plasmonic resonators". Nature Communications, 6:7032, May 2015, pp. 1-7.

Zhao, Zengyue. et al., "Selectively thermal radiation control in long-wavelength infrared with broadband all-dielectric absorber". Optics Express, vol. 27, No. 24/25, Nov. 2019, 35088-35095.

Nycz, Andrzej, et al., "Controlling substrate temperature with infrared heating to improve mechanical properties of large-scale printed parts". Additive Manufacturing 33 (2020) 101068, pp. 1-10.

Zhang, Xia, et al., "Controlling Thermal Emission by Parity-Symmetric Fano Resonance of Optical Absorbers in Metasurfaces." ACS Photonics 2019, 6, 2671-2676.

Khan, Shahrukh, et al., "Comparative accuracy testing of non-contact infrared thermometers and temporal artery thermometers in an adult hospital setting". American Journal of Infection Control 49 (2021) 597-602.

Chou, Ming-Dah, et al., "A Parameterization of the Effective Layer Emission for Infrared Radiation Calculations". Journal of the Atmospheric Sciences, vol. 62, Feb. 2005, pp. 531-541.

* cited by examiner

DUAL PYROMETER SYSTEMS FOR SUBSTRATE TEMPERATURE CONTROL DURING FILM DEPOSITION

CROSS-REFERENCE TO RELATED APPLICATIONS

This application claims priority to and the benefit of U.S. Provisional Patent Application No. 63/162,878, filed Mar. 18, 2021 and entitled "FILM DEPOSITION SYSTEMS AND METHODS," and U.S. Provisional Patent Application No. 63/270,673, filed Oct. 22, 2021 and entitled "DUAL PYROMETER SYSTEMS FOR SUBSTRATE TEMPERATURE CONTROL DURING FILM DEPOSITION," which are hereby incorporated by reference herein to the extent that they do not conflict with the present disclosure.

FIELD OF THE DISCLOSURE

The present disclosure relates generally to methods and systems for monitoring substrate temperatures in a semiconductor processing or reactor system, and, more particularly, to methods and apparatus for dual-zone monitoring, and use in heating controls, of temperatures of substrates in a semiconductor processing or reactor system performing deposition or growth including epitaxy.

BACKGROUND OF THE DISCLOSURE

Semiconductor processing, including chemical vapor deposition (CVD), is a well known process for forming thin films of materials on wafers including silicon wafers. In a CVD process, for example, gaseous molecules of the material to be deposited are supplied to wafers to form a thin film of that material on the wafers by chemical reaction. Such formed thin films may be polycrystalline, amorphous, or epitaxial. Typically, CVD processes are conducted at elevated temperatures to accelerate the chemical reaction and to produce high quality films, with some of these processes, such as epitaxial silicon deposition or EPI growth, being conducted at extremely high temperatures (e.g., greater than 900° C.).

To achieve the desired temperatures, wafers are heated using resistance heating, induction heating, or radiant heating. Since radiant heating is the most efficient technique, it is presently the favored method for many types of deposition processes including CVD processes. Radiant heating involves positioning infrared lamps around or in reaction chambers or reactors, with the lamps often being provided in a lamp bank adjacent the surface of the wafer upon which material is to be deposited. One problem, though, with use of radiant heat is a tendency to create nonuniform temperature distributions or temperature variations along the wafer surface including hot spots due to the use of localized radiant energy sources or lamps and consequent focusing and interference effects.

During a typical CVD process, one or more wafers are placed on a wafer support (or "susceptor") inside a chamber (or "reaction chamber") within the reactor. Both the wafer and the susceptor are heated to a desired temperature. In a typical wafer treatment step, reactant gases are passed over the heated wafer causing deposition of a thin layer of a desired material on the wafer's surface. If the deposited layer has the same crystallographic structure as the underlying silicon wafer, it is called an epitaxial or EPI layer (or a monocrystalline layer because it has only one crystal structure), and the reaction chamber may be labeled an epitaxy chamber. Through subsequent processes, these layers are made into integrated circuits.

To ensure high quality layers during CVD and other deposition processes, various process parameters must be carefully controlled, with the temperature of the wafer during each treatment step being one of the more critical. During CVD, for example, the wafer temperature dictates the rate of material deposition on the wafer because the deposition gases react at particular temperatures and deposit on the wafer. If the temperature varies across the surface of the wafer (e.g., a temperature uniformity such as a temperature differential), uneven deposition of the film may occur and the physical properties may not be uniform over the wafer surface. Furthermore, in epitaxial deposition, even slight temperature nonuniformity can result in undesirable crystallographic slip. In the semiconductor industry, it is important that the material be deposited uniformly thick with uniform properties over the wafer, as the wafer is often divided into individual chips having integrated circuits thereon. If a CVD process or other deposition step produces deposited layers with nonuniformities, devices at different areas on the chips may have inconsistent operation characteristics or may fail altogether.

More specifically, in thermal deposition tools or chambers such as those used for epitaxy, CVD, or atomic layer deposition (ALD), the deposition profile is sensitive to the temperature of the processed wafer. In channel, NMOS (N-type metal-oxide semiconductor), and PMOS (P-type metal-oxide semiconductor) deposition including Si, SiGe, SiP, and SiAs (especially in multi-layer deposition in advanced modes), the wafer thermal two-dimensional (2D) profile tunability, promptness, and accuracy are demanded to improve manufacturing yield and throughput.

Hence, there is a demand for a methodology to accurately measure and control wafer temperatures including those at the wafer far edge during epitaxial growth and other deposition processes.

SUMMARY OF THE DISCLOSURE

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

The inventors recognized that existing single zone temperature controls present a number of challenges in substrate processing including in channel, NMOS, and PMOS applications. First, existing center controls may result in center-to-edge thickness roll off. Due to different substrate types or chip designs, emissivity may differ, which can lead to different center-to-edge thermal profiles in lamp-heated systems. Particularly, a patterned substrate far edge, which can be greatly impacted by surrounding thermal environments, may show discontinuity in its thermal profile, and this can be one of the most challenging issues in the semiconductor industry. Existing thermocouple-based control does not directly measure substrate temperature and, further, does not provide substrate edge temperature readings for real-time substrate monitoring and feedback control over heating.

Additionally, the inventors understood that single temperature control does not provide real-time tunability for center-to-edge temperatures or differentials that would be useful for film uniformity. Since single-zone control, for example, only has a single point feedback, when running a large number of substrates or multiple layers on the same substrate, profile shift may increase with the increase of substrate quantity or layer quantity. The prior methods of tuning the center-to-edge substrate profile is linear lamp power ratio adjustment to try to achieve different power distribution among top and bottom lamps of the heater assembly. As a result, the substrate temperature at different location can be tuned. However, thickness and dopant profiles are different on different types of substrates, chip designs, gas flows, and film thicknesses. For example, thickness center-to-edge provides show a big difference between a blanket substrate and a patterned substrate. Different center-to-edge temperatures with the same lamp power distribution may be due to the different surface emissivity and edge thermal transfer with a susceptor. These uncertainties lead to a challenge in optimizing lamp power ratios to minimize center-to-edge non-uniformity on a substrate being processed in a reactor system.

Disclosed herein, according to various embodiments, is a method of operating a reactor system to provide multi-zone substrate temperature control. The method includes, with a first pyrometer, sensing a temperature of a first zone of a substrate supported in the reactor system, and, with a second pyrometer, sensing a temperature of a second zone of the substrate. The method further includes, with a controller, comparing the temperatures of the first and second zones to setpoint temperatures for the first and second zones and, in response, generating control signals to control heating of the substrate. The method also includes controlling, based on the control signals, operations of a heater assembly operating to heat the substrate.

In some implementations of the method, the heater assembly includes a plurality of heat generators (such as elongated filament heater elements, heat lamps (such as spot lamps), and the like), and the controlling includes mapping predefined electric power to each of the plurality of heat generators. In such cases, the controlling may also include providing proportional amounts of the predefined electric power to each of the plurality of heat generators assigned to a first group associated with heating the first zone and to each of the plurality of heat generators assigned to a second group associated with heating the second zone. Further, the method may include repeating the sensing of the temperature of the first zone, the sensing of the temperature of the second zone, the comparing of the temperatures, and the controlling of the operations of the heater assembly to provide a closed-loop control over heating of the substrates to reach the setpoint temperatures.

In the same or other implementations of the method, the first and second pyrometers each may be an infrared (IR) pyrometer that senses temperatures of a spot on the substrate to detect or determine the first and second zone temperatures. In such cases, the first zone may be a center zone of the substrate extending from a center of the substrate to an outer radius and the second zone may be an edge zone of the substrate extending from the outer radius of the center zone to an edge of the substrate. The spot associated with the second pyrometer can have a center point at a location on the substrate at a radial offset from the edge of the wafer of about 1 to about 20 millimeters. Also, the radial offset from the edge of the substrate can be in the range of about 4 to about 10 millimeters, and the spot monitored by the second pyrometer can have an outer diameter in the range of about 1 to about 15 millimeters.

Further, according to various aspects of the description, a reactor system is taught for providing zone-based substrate temperature control. The system includes a reaction chamber in which a susceptor is provided for supporting a substrate. The system also includes a plurality of thermal generators operable to heat the substrate on the susceptor and a temperature monitoring assembly including first and second pyrometers reading temperatures in a center zone and an edge zone of the substrate. The reactor system additionally may include a controller controlling a first set of the thermal generators based on the temperature of the center zone and a second set of the thermal generators differing from the first set based on the temperature of the edge zone.

In some implementations of the system, the thermal generators each includes a heat lamp, and the controller controls operations of the thermal generators by directing first and second levels of electric power to the thermal generators of the first and second sets based on a comparison of the temperatures of the center and edge zones sensed by the first and second pyrometers to predefined temperature setpoints for the first and second zones. In such cases, the controller can be configured to independently provide proportional-integral-derivative (PID) control to the thermal generators of the first and second sets based on ongoing feedback from the first and second pyrometers.

In the same or other implementations of the reactor system, the second pyrometer senses temperatures of a sensor spot on the substrate with an outer diameter in the range of about 1 to about 15 millimeters. Additionally, the sensor spot may have an outer diameter in the range of about 4 to about 8 millimeters that is centered at a radial offset from the edge of the substrate in the range of about 4 to about 10 millimeters. In some embodiments, the reactor system includes a reflector, and the second pyrometer is attached to an upper surface of the reflector with a mounting stand. The reflector may include a transmission channel, and the mounting stand comprises a chamber for receiving a lens tube of the second pyrometer, whereby electromagnetic radiation emitted from the upper surface of the substrate (and/or developing film thereon) is transmitted through the upper wall of the chamber, through the transmission channel, and is received at the second pyrometer. Additionally, the chamber may include an aperture through which the emitted electromagnetic radiation is transmitted, which has an outer diameter defining the outer diameter of the sensor spot at the upper surface of the substrate (or the developing film thereon).

In still other aspects of the description, a reactor system is presented that is configured for providing real-time substrate temperature variation control (e.g., center-to-edge temperature differential control). The system includes a plurality of heat lamps operable to heat a substrate supported upon a susceptor, and a temperature monitoring assembly including a center pyrometer and an edge pyrometer for sensing, respectively, a temperature in a center zone of the substrate and a temperature in an edge zone of the substrate. Additionally, the reactor system includes a controller operating the plurality of heat lamps based on a comparison of the temperatures of the center and edge zones to temperatures setpoints for the center and edge zones. During the operating of the reactor system, the controller generates control signals to independently operate a first set of the heat lamps to heat the center zone of the substrate and a second set of the heat lamps, differing from the first set, to heat the edge zone of the substrate.

In some implementations of the reactor system, the control signals are configured to proportionally set amounts of electric power provided to the first and second sets of the heat lamps, and PID control is applied independently to each of the first and second sets of the heat lamps. In these or other embodiments, the edge pyrometer senses or monitors temperatures in its field of view or a sensor spot on the substrate with an outer diameter in the range of 1 to 15 mm, and the sensor spot is centered at a radial offset from the edge of the substrate in the range of 4 to 10 mm.

The reactor system may further include a reflector, and the edge pyrometer can be attached to an upper surface of the reflector with a mounting stand. The reflector may include a transmission channel, and the mounting stand may include a chamber for receiving a lens tube of the edge pyrometer, whereby electromagnetic radiation emitted by the upper surface of the substrate (or the developing film on the upper surface of the substrate) is directed or transmitted through the upper wall of the chamber to the transmission channel, and therethrough to the pyrometer. Additionally, the reflector may include an aperture through which the electromagnetic radiation emitted by the upper surface of the substrate (or developing film) is transmitted, the aperture having an outer diameter defining the outer diameter of the sensor spot.

All of these embodiments are intended to be within the scope of the disclosure. These and other embodiments will become readily apparent to those skilled in the art from the following detailed description of certain embodiments having reference to the attached figures, the disclosure not being limited to any particular embodiment(s) discussed.

BRIEF DESCRIPTION OF THE DRAWING FIGURES

While the specification concludes with claims particularly pointing out and distinctly claiming what are regarded as embodiments of the disclosure, the advantages of embodiments of the disclosure may be more readily ascertained from the description of certain examples of the embodiments of the disclosure when read in conjunction with the accompanying drawings. Elements with the like element numbering throughout the figures are intended to be the same.

DETAILED DESCRIPTION

Figure 1:
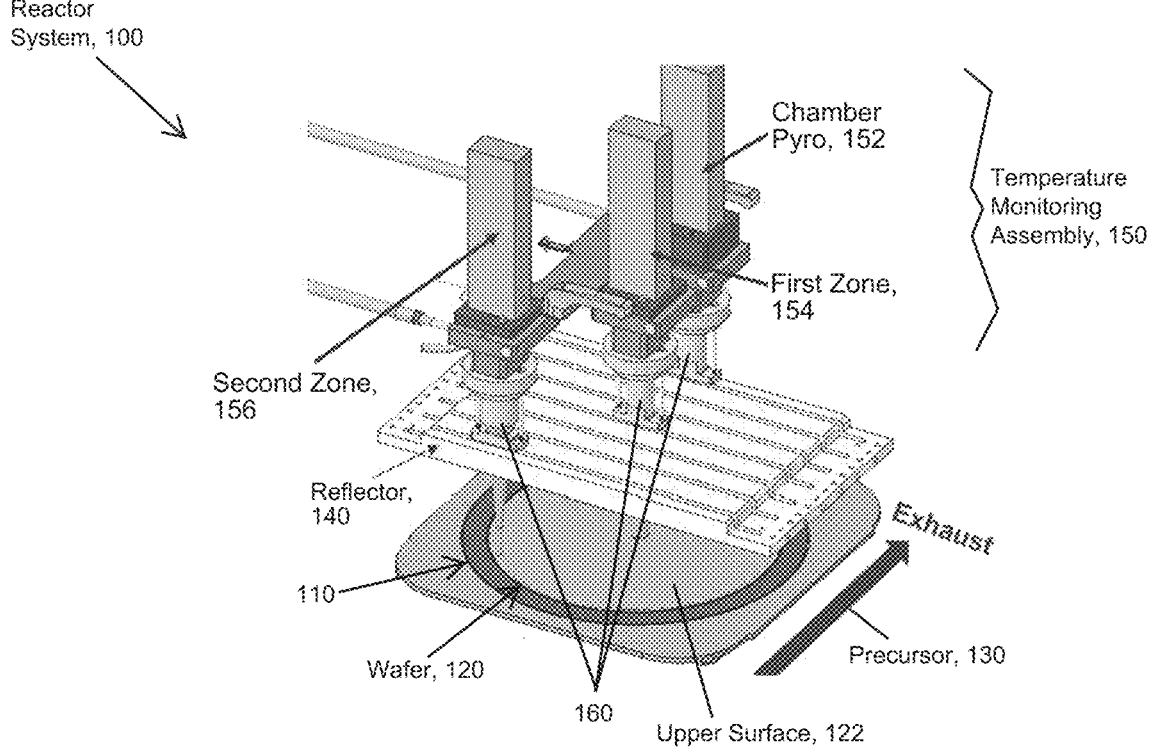
FIG. 1 is a simplified top perspective view of a portion of a reactor system with a temperature monitoring assembly of the present description for providing dual-zone temperature control.

Although certain embodiments and examples are disclosed below, it will be understood by those in the art that the disclosure extends beyond the specifically disclosed embodiments and/or uses of the disclosure and obvious modifications and equivalents thereof. Thus, it is intended that the scope of the disclosure should not be limited by the particular embodiments described herein.

The illustrations presented herein are not meant to be actual views of any particular material, apparatus, structure, or device, but are merely representations that are used to describe embodiments of the disclosure.

As used herein, the term "substrate" may be used to refer to any underlying material or materials that may be used, or upon which, a device, a circuit, or a film may be formed. A substrate can include a wafer, such as a 300-millimeter silicon wafer. A substrate can be a blanket substrate or can include a patterned substrate, such as a patterned wafer used to fabrication a semiconductor device.

As used herein, the term "chemical vapor deposition" (CVD) may refer to any process wherein a substrate is exposed to one or more volatile precursors, which react and/or decompose on a substrate surface to produce a desired deposition.

As used herein, the term "atomic layer deposition" (ALD) may refer to a vapor deposition process in which deposition cycles, preferably a plurality of consecutive deposition cycles, are conducted in a process chamber. Typically, during each cycle the precursor is chemisorbed to a deposition surface (e.g., a substrate surface or a previously deposited underlying surface such as material from a previous ALD cycle), forming a monolayer or sub-monolayer that does not readily react with additional precursor (i.e., a self-limiting reaction). Thereafter, if necessary, a reactant (e.g., another precursor or reaction gas) may subsequently be introduced into the process chamber for use in converting the chemisorbed precursor to the desired material on the deposition surface. Typically, this reactant is capable of further reaction with the precursor. Further, purging steps may also be utilized during each cycle to remove excess precursor from the process chamber and/or remove excess reactant and/or reaction byproducts from the process chamber after conversion of the chemisorbed precursor. Further, the term "atomic layer deposition," as used herein, is also meant to include processes designated by related terms such as, "chemical vapor atomic layer deposition", "atomic layer epitaxy" (ALE), molecular beam epitaxy (MBE), gas source MBE, or organometallic MBE, and chemical beam epitaxy when performed with alternating pulses of precursor composition(s), reactive gas, and purge (e.g., inert carrier) gas.

As described in greater detail below, various details and embodiments of the disclosure may be utilized in conjunction with a reaction chamber configured for a multitude of deposition processes, including but not limited to, ALD, CVD, metalorganic chemical vapor deposition (MOCVD), molecular beam epitaxy (MBE), and physical vapor deposition (PVD). The embodiments of the disclosure may also be utilized in semiconductor processing systems configured for processing a substrate with a reactive precursor, which may also include etch processes, such as, for example, reactive ion etching (RIE), capacitively coupled plasma etching (CCP), and electron cyclotron resonance etching (ECR).

The inventors recognized the importance of sensing and monitoring the magnitude of the temperature variation (e.g., temperature differential between the center and edge of a substrate) in real-time and controlling a heating assembly using the real-time temperatures of the substrate to achieve a desired temperature differential (or variation limit). The sensing and monitoring can be performed using a dual-zone embodiment to limit (or tune) cross-wafer film thickness variation, i.e., within wafer film thickness non-uniformity. The real-time sensing and monitoring can also (or alternatively) be employed to limit layer to layer mean thickness variation in silicon germanium/silicon film stacks, such as in film stacks employed to fabrication finFET or gate-all-around semiconductor devices. And the real-time sensing and monitoring can further be employed to control transition thickness (i.e., the rate at which germanium concentration changes) in such silicon germanium/silicon film stacks.

The sensing and monitoring of temperature variation in real-time and controlling the heating assembly using the real-time temperature measurement may limit within-layer thickness variation in certain epitaxial deposition operations. For example, within-layer film thickness non-uniformity may be less than about 1.4% for silicon germanium layers deposited using real-time temperature measurements acquired using the apparatus and methods of the present disclosure. The within-layer film thickness mean-plus-three-sigma of the silicon germanium layers may be between about 30% and about 60% smaller (e.g., about 40% smaller) than the mean-plus-three-sigma of otherwise identical silicon germanium layers deposited using indirect temperature sensing and control techniques. Within-layer film thickness non-uniformity may be less than about 1.1% for silicon layers deposited using real-time temperature measurements acquired using the apparatus and methods of the present disclosure. The within-layer film thickness mean-plus-three-sigma of the silicon layers may be between about 30% and about 60% smaller (e.g., about 50% smaller) than the mean-plus-three-sigma of otherwise identical silicon layers deposited using indirect temperature sensing and control techniques.

The sensing and monitoring of temperature variation in real-time and controlling the heating assembly using the real-time temperature measurement may limit layer-to-layer thickness variation in certain epitaxial film stack deposition operations. For example, in film stacks having alternating silicon germanium and silicon layers, layer-to-layer mean thickness non-uniformity among the silicon germanium layers forming the film stack may be less than about 0.6% of a common mean film thickness. Layer-to-layer mean thickness non-uniformity among the silicon layers forming the film stack may also be less than about 0.6% of a common mean film thickness. As will be appreciated by those of skill in the art in view of the present disclosure, limiting within-layer and layer-to-layer non-uniformity may improve electrical properties of semiconductor devices formed from such film stacks, such through limited channel width variation (and thereby superior carrier mobility) in finFET and/or gate-all-around semiconductor devices formed from the films stacks.

FIG. 1 illustrates a reactor system 100 using a simplified top perspective view showing a portion of components that may be provided within and adjacent to a reaction chamber configured for epitaxial (EPI) growth or other deposition processes. The system 100 is designed to achieve real-time dual-zone substrate temperature control (e.g., with a closed-loop controller design). Within the inner chamber of the reaction chamber of system 100, a susceptor 110 is provided for supporting (and, typically, rotating) a substrate 120. The system 100 is configured according to this description to have the capability to provide real-time temperature variation (e.g., center-to-edge differential) control between the substrate center and the edge of the substrate 120 so as to control cross-substrate film thickness variation (e.g., film roll-up or roll-down at the edge of the substrate) due to temperature differential during deposition between the center and the edge of the substrate during deposition on an upper surface 122 of the substrate 120. During deposition processes, gas flow of precursors, reactants, the like flows over the substrate 120 positioned within the reaction chamber as shown by arrow 130. The precursor(s) may include one or more of: (a) a silicon-containing precursor such as silane; (b) a germanium-containing precursor such as germane, (c) a dopant-containing precursor such as an arsenic or phosphorous-containing dopant, (d) a halide-containing gas such as hydrochloric acid, and (e) a carrier gas such as hydrogen. Heating of the substrate 120 may be provided by a heater assembly (shown, for example in FIGS. 3 and 8) that includes a set or array of thermal or heat generators (upper or top generators (which may be lamps)) provided below a reflector 140 such as in a lamp bank 140 (as well as a set or array of thermal or heat generators (lower or bottom generators (which may be lamps) discussed below), which is spaced apart some distance from the upper surface 122 of the substrate 120.

A temperature monitoring assembly 150 is provided that includes a chamber pyrometer 152 for measuring a temperature of the upper wall of the chamber (or quartz temperature) along with a first zone or center pyrometer 154 and a second zone or edge pyrometer 156. Each of the pyrometers 152, 154, and 156 is supported above the lamp bank, e.g., with a mounting stand 160 attached to reflector 140. The heater elements radiantly heat the substrate 120 through the susceptor 110. The heated substrate 120, and developing film on surface 122, emit electromagnetic radiation. The pyrometers 154, 156 collect electromagnetic radiation emitted from a portion of the substrate (and/or developing film) within the field of view of the pyrometer 154, 156. The center and edge pyrometers 154, 156, during their operations, have field of views or corresponding sensor areas or spots (or sense or monitor temperatures in their field of view or sensor areas/spots) on the upper surface 122 of the substrate 120 as part of sensing or reading temperatures. Each pyrometer has a field of view. In some examples the field of view of the center pyrometer 154 may be the same size as that of field of view of the edge pyrometer 156. In some examples, the field of view of the edge pyrometer 156 may be smaller than that of the center pyrometer 154. This reduces error in temperature measurements acquired by the edge pyrometer, for example, when emissivity of the substrate changes relatively rapidly in the radially outward direction. The electromagnetic radiation is collected through gaps/spaces between linear lamps in the top or upper lamp bank and, in most cases, the reflector 140 prior to transmission through the corresponding mounting stand 160. In some cases, the emitted electromagnetic radiation passes along an optical path extending between the pyrometer and the upper surface of the wafer, the optical path including (a) an optical fiber connecting the pyrometer to a mount (coupler or stand), (b) an aperture extending through the reflector, (c) a gap between heater elements, and (d) a quartz material forming the upper wall of the reaction chamber.

The stands 160 are positioned on the reflector 140, when included, so that the spots/sensor areas (i.e., fields of view) of the center and edge pyrometers 154 and 156 are located in two zones of the substrate 120 or its surface 122 or in center and edge zones. This can be seen in FIG. 2, which is a top view of the substrate 110 during temperature monitoring operations (and processing in the reaction chamber) of the assembly 150. As shown, a center point of the center pyrometer substrate spot 250 is proximate to the center of the substrate 120, such as in a radial offset (or at a radius) of 1 to 20 millimeters, with 1 to 10 millimeters being more preferred (and 9.78 mm used in one embodiment to suit a particular linear lamp array and gaps between an adjacent pair of centrally located lamps). The center spot 250 may be relatively large such as with a width (e.g., an outer diameter (OD)) in the range of about 10 to about 30 millimeters with a 20 millimeter OD used in some embodiments.

Figure 2:
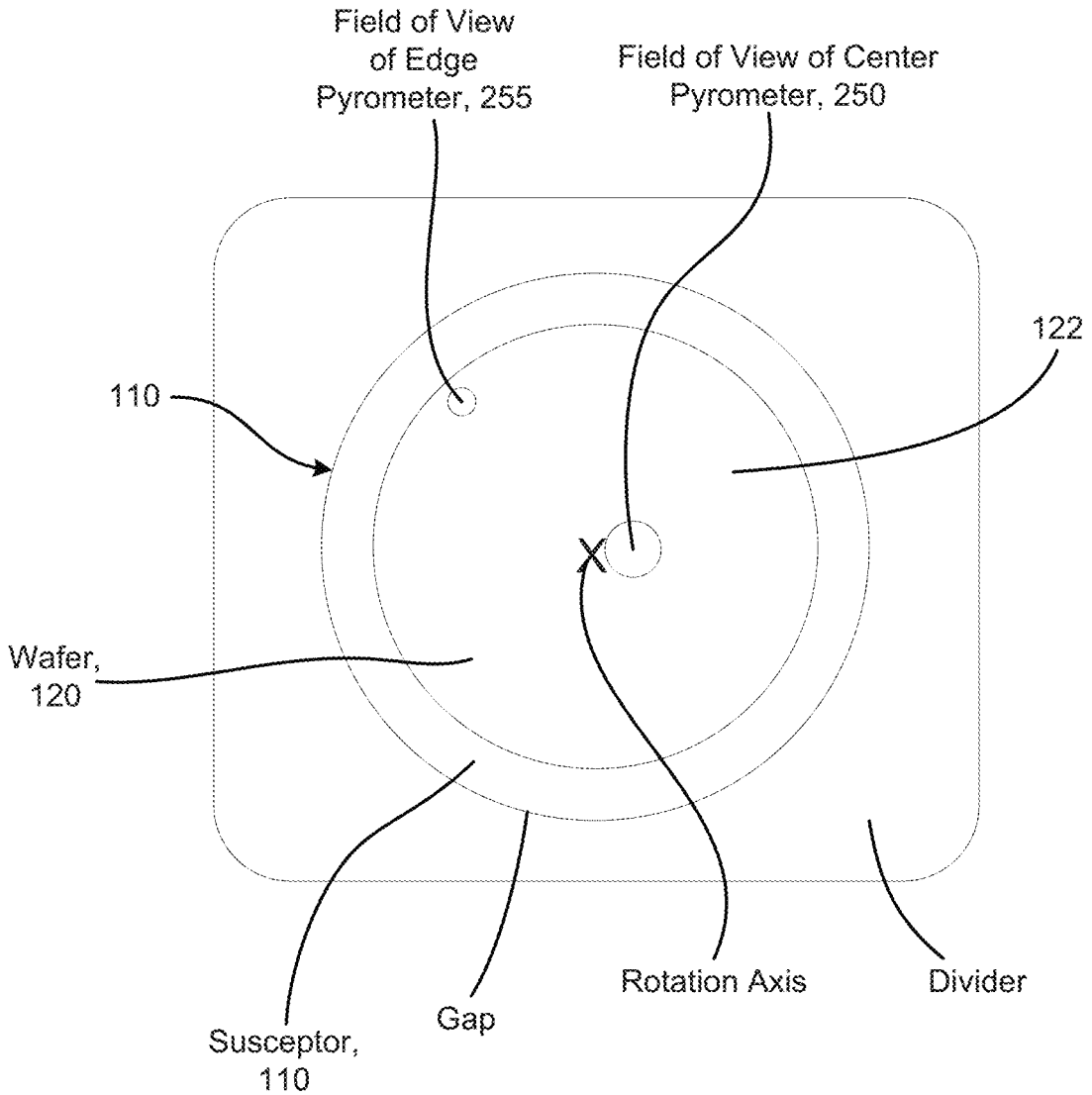
FIG. 2 is a top view of a substrate in the reactor system of FIG. 1 during operations of the dual-zone temperature monitoring assembly.

Further, as shown in FIG. 2, the center point of edge pyrometer substrate spot (i.e., field of view) 255 is proximate to the edge of the substrate 120. It may be in a radial offset or radius that is within about 20 millimeters of the edge, e.g., at about 130 to about 150 millimeters with a substrate 120 having a radius of 150 millimeters, and some embodiments place the radial offset or radius within about 10 millimeters of the substrate edge, with one embodiment placing the offset or radius in the range of about 4 to about 9 millimeters of the substrate edge, such as at about 142 millimeters on a R150 millimeter substrate. The edge pyrometer substrate spot (i.e., field of view) 255 is also preferably smaller than the center pyrometer substrate spot 250. Particularly, the spot 255 may have an OD in the range of about 1 to about 15 millimeters or more preferably about 1 to about 10 millimeters, and one useful embodiment provides a spot 255 with an OD in the range of about 4 to about 6 millimeters (with about 5 millimeters shown in FIG. 2). This smaller spot size provides more accuracy in the temperature reading, while providing an acceptable signal to noise ratio with existing technologies (note, though, that smaller spot sizes near in the range of about 1 to about 4 millimeters may be useful as technologies improve).

In some cases, the field of view of the edge pyrometer may be described in relation to the field of view of the center pyrometer. In this respect, (a) the susceptor is supported for rotation within the reaction chamber about a rotation axis; (b) the center pyrometer is arranged along a first optical axis extending through the upper wall of the reaction chamber and intersecting the susceptor; (c) the field of the view of the center pyrometer overlays the susceptor at a location radially offset from the rotation axis by between about 0 millimeters and about 10 millimeters; (d) the edge pyrometer is arranged along a second optical axis also extending through the upper wall of the reaction chamber and intersecting the susceptor at a location radially outward of the first optical axis; and (e) the field of view of edge pyrometer also overlays the susceptor at a location radially outward of the field of view of the center pyrometer, e.g., less than about 150 millimeters radially offset from the rotation axis. The chamber pyrometer can have a field of view radially offset from the either (or both) the first and second pyrometers, and is also configured to acquire temperature of the upper wall of the reaction chamber using electromagnetic radiation emitted by the upper wall of the chamber, e.g., by measuring intensities of wavelengths in a waveband different than that measured by the center and edge pyrometers.

With the use of two pyrometers 154 and 156 to measure substrate temperatures, the substrate 120 (or its upper surface 122) may be divided into two (or more) zones or a center zone and an edge zone (or first and second zones), and temperatures of these zones are monitored by radially positioning a pyrometer in each as shown by sensor areas or spots 250 and 255. The specific size of each zone and the location of the pyrometer associated with those zones may vary to practice the system 100 as long as the spots/sensor areas fall within the associated zone. For example, a substrate 120 may have a radius of 150 millimeters (which may be designated as R150 mm), and the zones may be sized as follows: (a) center zone from substrate center to an outer circumference at a radius in the range of about 130 to about 145 millimeters; and (b) edge zone from outer circumference of the center zone to an outer circumference at or near the substrate edge.

Figure 3:
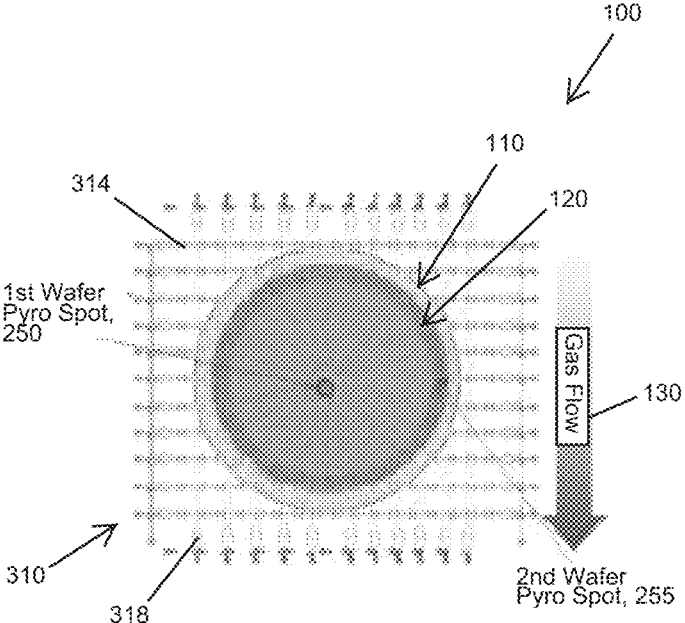
FIG. 3 illustrates a top view of a portion of the reactor system of FIG. 1 showing a chamber heating (or heater) assembly relative to the substrate and the susceptor shown in FIG. 2.

FIG. 3 illustrates a top view of a portion of the reactor system 100 showing a chamber heating (or heater) assembly 310 relative to the substrate 120 and the susceptor 110 shown in FIG. 2 and with gas flow as shown by arrow 130. More specifically, to control temperatures of the substrate 120, the system 100 includes a chamber heating assembly 310 with a bottom or lower bank or array 314 and a top or upper bank or array 318 of heat lamps. The lamps may take a variety of forms and shapes to implement the system 100 including spot and/or linear lamps that may provide light energy or signals using light emitting diodes or other technologies. As shown, for example, the bottom and top banks 314, 318 each includes a plurality of linear lamps, with 11 shown in each bank 314, 318, arranged in spaced-apart planes below and above the susceptor 110 and substrate 120. The lamps are arranged in each bank/array 234, 238 to be parallel to each other with a uniform spacing between adjacent pairs.

Figure 4:
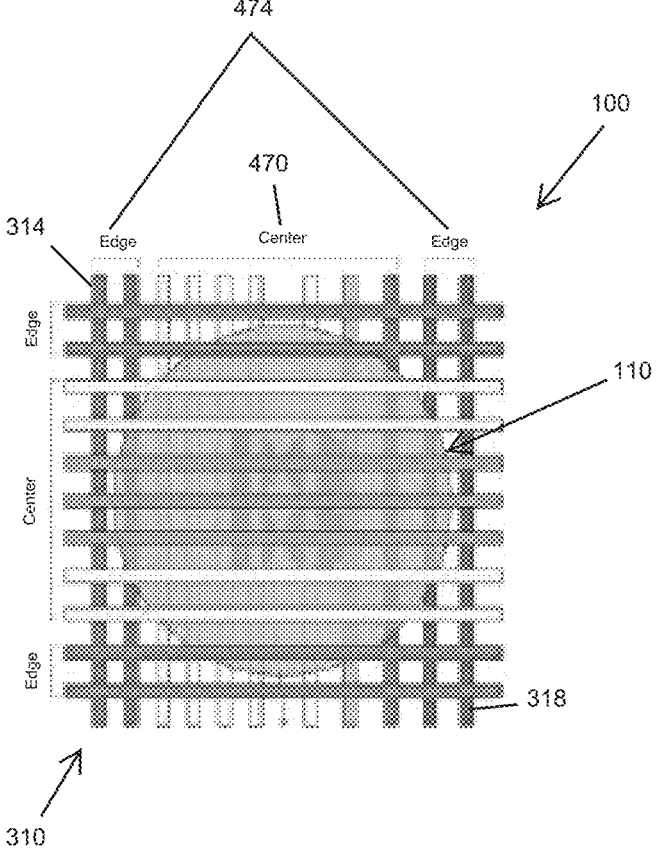
FIG. 4 illustrates a bottom view of the portion of the reactor system of FIG. 3 illustrating useful groupings of the heaters into two groups or sets to control heating of dual zones of the substrate.

FIG. 4 illustrates a bottom view of the portion of the reactor system 100 illustrating useful groupings of the heaters into two groups or sets to control heating of dual zones of the substrate. The lamps of the array/bank 318 (and bottom or lower array/bank 314 of FIG. 3) may be divided into or assigned to control zones and be controlled concurrently as sets/units based on real-time temperature feedback from pyrometers in those physical zones (e.g., pyrometers above the lamp bank within or between lamps of the same heating or control zones or one or more pyrometer having a field of view within each of the two zones).

In this particular, but non-limiting, example, the top lamp array 318 (and, likewise, the bottom lamp array 314) is divided into two control groups or zones that correspond with a center zone and an edge zone two zone of the substrate 120 (shown in FIG. 2), and these are the center group 470 (made up of the center six lamps) and the edge group 474 (made up of two pairs of lamps on either side (or opposite sides) of the center group 470). The number and location of the lamps in each control group 470, 474 may vary with it generally being preferable that lamps in each group are chosen based on the portion or area of the substrate 120 that they heat during operations (e.g., assign lamps that heat the edge of the substrate 120 to the edge control group 474 and so on).

In the examples of FIGS. 3 and 4, the system 100 is adapted to provide dual-zone substrate temperature control for an existing lamp bank design with twenty-two linear lamps. As shown, the linear lamps were separated into two groups (i.e., center and edge groups 470 and 474 in FIG. 4), and the lamps of lower and upper banks/arrays 314, 318 may be operated using two closed-loop proportional integral derivative (PID) control or other control approaches. Two pyrometers 154 and 156 may be used to measure substrate center and edge zone temperatures, which are provided as feedback to the controller to actuate the power of the two groups 470, 474.

Figure 5:
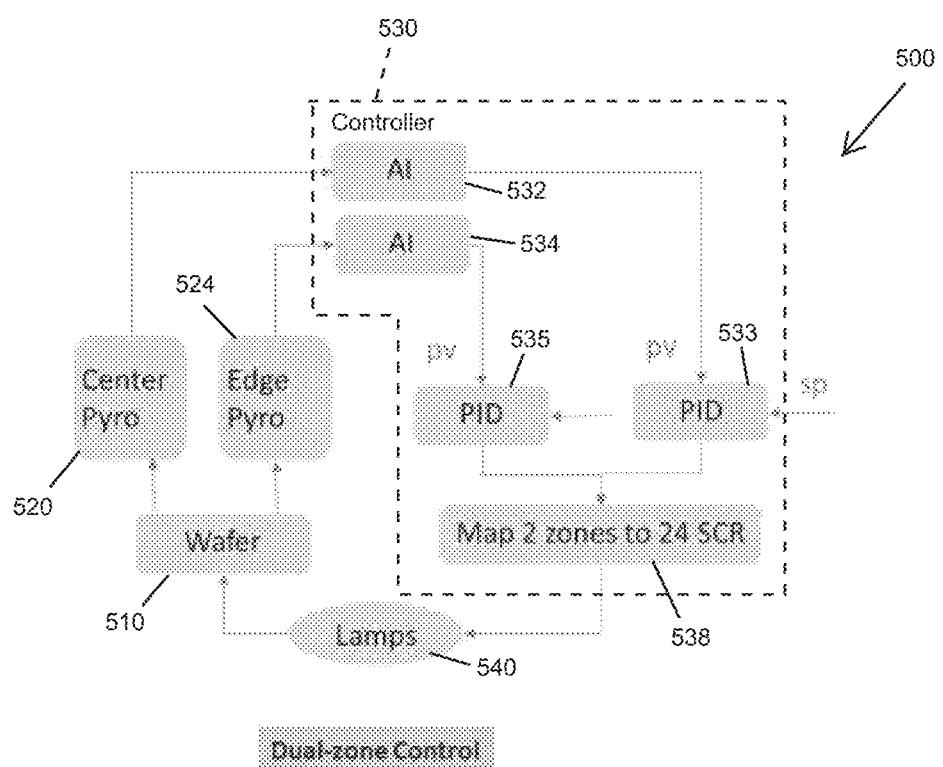
FIG. 5 is a control schematic of a reactor system including the temperature monitoring components along with a controller configured to provide dual-zone control of lamps of a heating (or heater) assembly.

FIG. 5 illustrates a schematic of a reactor system 500 modified to include or implement dual-zone control. As shown, a plurality of lamps 540 are used to heat a substrate 510, and these lamps may be divided into and controlled as two zones or groups. A center pyrometer 520 is used to monitor temperatures of a center zone of the substrate 510 while concurrently an edge pyrometer 524 is used to monitor temperatures of an edge zone of the substrate 510. Temperature outputs of the pyrometers 520 and 524 (e.g., sensed or read temperatures or signals corresponding to temperatures) are fed to software or artificial intelligence (AI) modules 532 and 534, respectively, of a controller (e.g., a controller of a heating or heater assembly) 530.

The modules 532, 534 may act to compare the sensed or read temperatures from the pyrometers 520, 524 to desired temperature setpoints for the center and edge zones of the substrate 510 during a particular process (e.g., epitaxial growth), and such temperature setpoints may be stored in memory (not shown in FIG. 5) that is accessible by the controller 530, which typically would further include a processor(s) executing code or instructions to provide the functions of the AI modules 532, 534 and PID modules 533, 535.

Such processes may take relatively long periods of time to complete, such as 30 to 90 minutes, and the control provided by controller 530 is preferably ongoing over the entire process (including, in some cases, pre and post-deposition/growth steps). The outputs of the AI modules 532, 534 of each zone are provided to PID modules 533 and 535 to bring the read temperatures to the desired setpoint temperatures by transmitting control signals to heater control units or switches, such as silicon-controlled rectifiers (SCRs), to adjust the proportion of the overall heat lamp electric power provided to each zone of lamps 540, with each lamp in each zone typically receiving matching power levels.

The system 500 is configured to allow independent and dual-zone closed-loop temperature control. Compared to single-zone feedback control, dual-zone pyrometer control increases the independent tunability of the substrate center and edge thermal profile by automatic adjusting of the SCR power ratio by the AI modules 532, 534 and PID modules 533, 535. Given pyrometers function as non-contact and instant sensor determining substrate temperatures from the amount of thermal radiation it emits, a target edge-to-center thermal profile tuning can be achieved directly on substrate with a very short transition time regardless of substrate type, chip design, and environment impact.

The dual-zone control of the present description, which may be implemented as shown in system 500 of FIG. 5, is useful for providing real-time and stable center-to-edge temperature control during film growth (and other substrate processing in a chamber heated by heat lamps). Examples of films deposited on the substrate include: (a) silicon films, (b) silicon-germanium films, and (c) doped silicon films such phosphorous doped and arsenic doped films. At steady status, dual pyrometer closed-loop control enables a stable temperature at both the substrate center and at the substrate edge via real-time adjustment of silicon-controlled rectifier (SCR) power. With film growth, for example, the emissivity of the substrate (e.g., emissivity at about 0.68) and surrounding environment including the susceptor edge (e.g., emissivity at about 0.99) and the chamber (e.g., emissivity at about 0.53) changes with deposition.

A single zone temperature control regime controls lamp output power (and associated wafer heating) uniformly across the wafer according to a single measurement and therefore, does not appreciate temperature differentials between the center and edge portions of the wafer during film deposition, for example, due to emissivity changes on the substrate. As a consequence, film thickness may vary in correspondence to temperature change during deposition of the film onto the wafer. Thus, the substrate center and edge temperature shift is observed with single zone control. In contrast, with instant and real-time temperature feedback from pyrometers at the center and edge of substrate (or in the center and edge zones of the substrate), the thermal transition period can be minimized (or at least reduced) across the substrate to achieve high throughput and high repeatability. With the new approach described herein, control of the film thickness profile can be achieved by controlling any differential between temperature at the center portion of the wafer (and developing film) and the edge portion of the wafer (and developing film). Other benefits may exist, such as reduced within layer variation (when desired) and reduced defects (such as due to crystallographic slip), while the new approach is especially useful for providing the ability to control the film thickness profile across the wafer.

In some embodiments, the temperature monitoring assembly includes a small spot size edge pyrometer to measure extreme edge (or edge zone) substrate temperatures. By adding an edge pyrometer to determine the substrate edge temperature, more flexibility on pyrometer sensor selection is granted. The center and edge pyrometers may be identical in some cases, but it may be useful in some implementations for the aperture within the center mount and the edge mount (or apertures within the reflector) to be differently sized, which changes the size of the field of view of the edge pyrometer and the center pyrometer. Compared with a conventional pyrometer that may be used to measure center zone substrate temperatures, the pyrometer chosen for the edge pyrometer is selected to capture and control far edge temperature using small detecting spots that can be more readily used for reading or sensing the edge zone temperature needed for dual-zone control. Because the spot is smaller than the center spot, e.g., having an OD of about 5 millimeters which is much smaller than conventional pyrometers at ODs of about 20 millimeters or the like, the location of the edge pyrometer can be set even further from the center of the substrate and nearer the edge than previously practical.

Figure 6:
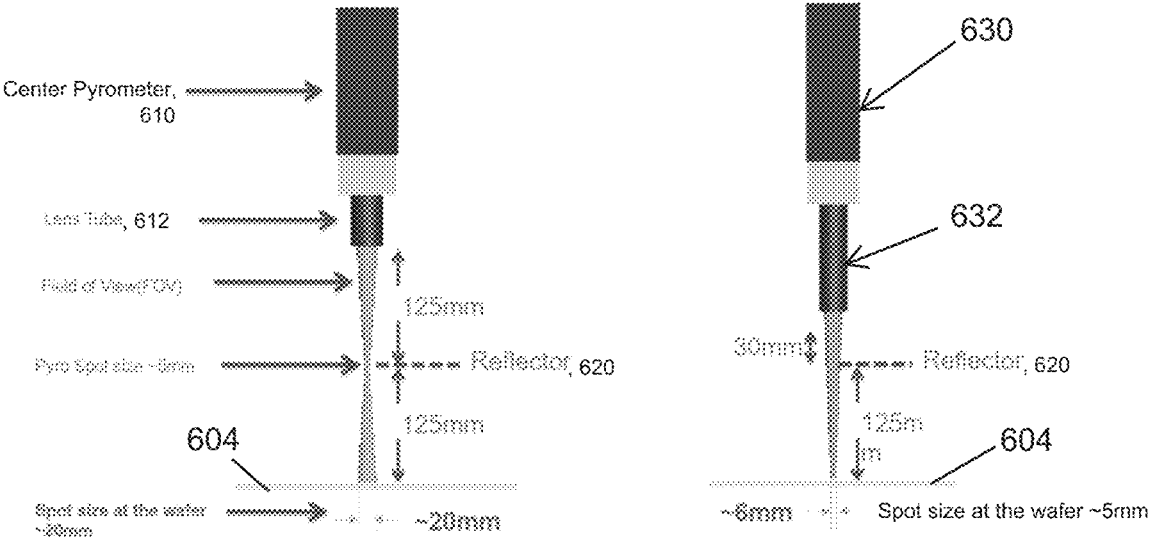
FIG. 6 is a side view of a center pyrometer and an edge pyrometer for use in a temperature monitoring assembly of the present description to monitor differing spot sizes.

FIG. 6 is a side view of a center pyrometer 610 and an edge pyrometer 630 for use in a temperature monitoring assembly of the present description to achieve differing spot sizes. Particularly, the inventors recognized that a new edge pyrometer design may be used to reduce spot size at a substrate 604 to enhance far edge temperature measurement. Far edge temperature measurement and its temperature control (based on feedback to the heater controller from the far edge (or edge zone) pyrometer) is highly useful in controlling temperatures across the substrate.

As shown in FIG. 6, a center pyrometer 610 may receive energy from its lens tube 612 to provide, based on its field of view (fov) and working distance and relative location of the reflector 620 and substrate 604, a spot size (i.e., field of view) on the substrate 604 in the range of about 15 to about 25 millimeters (with about 20 millimeters shown in FIG. 6 as an example). The pyrometer receives electromagnetic radiation emitted from the wafer (and developing film) and generates therefrom a signal containing information indicative of temperature of the wafer (and developing film) at the radial offset of the edge pyrometer. More particularly, the reflector 620 is placed equidistant from an outlet of the lens tub 612 and from the substrate 604 (or its upper surface), e.g., with a working distance of about 250 millimeters the outlet of the tube 612 is about 125 millimeters from the reflector 620 and the substrate 604 is about 125 millimeters from the reflector 620. This provides a field of view or spot for the edge pyrometer 610 (and middle pyrometer in some cases) in the range of about 15 to about 25 millimeters (such as about 20 millimeters), which may be at the center of the substrate 604 or some offset from the substrate edge to be center zone (or middle zone).

For the edge pyrometer 630, a tube 632 with a longer length is utilized to reduce the working distance and have a field of view or a spot size/sensor area with a radius in the range of about 2 to about 10 millimeters, with a spot having a width (e.g., radius) of about 4 to about 6 millimeters being the illustrated example with a width of about 5 millimeters being shown. The length of the lens tube 632 is shown in FIG. 6 to be selected such that the outlet of the lens tube 632 is much closer to the reflector 620 than for tube 612 of the center pyrometer. For example, this separation distance may be in the range of about 25 to about 35 millimeters with a separation distance of about 30 millimeters shown, while retaining the reflector-to-substrate distance (e.g., a distance of about 125 millimeters), and this provides a field of view or sensor area/spot with an outer diameter of about 5 millimeters. With this edge pyrometer design, the edge pyrometer can be moved (along with its sensor area or spot) to a location close to the substrate edge (e.g., to a radial offset from the substrate center in the range of about 130 to about 150 millimeters such as about 142 millimeters in certain examples) for a better far edge temperature control.

In other embodiments, the working distance is set by lowering the pyrometer 630 within the lamp bank to place the tube outlet closer to the reflector 620 and substrate 604, while other embodiments may utilize optical assemblies to achieve the reduced working distance and smaller spot size shown in FIG. 6 of about 6 millimeters or less in outer diameter.

Figure 7:
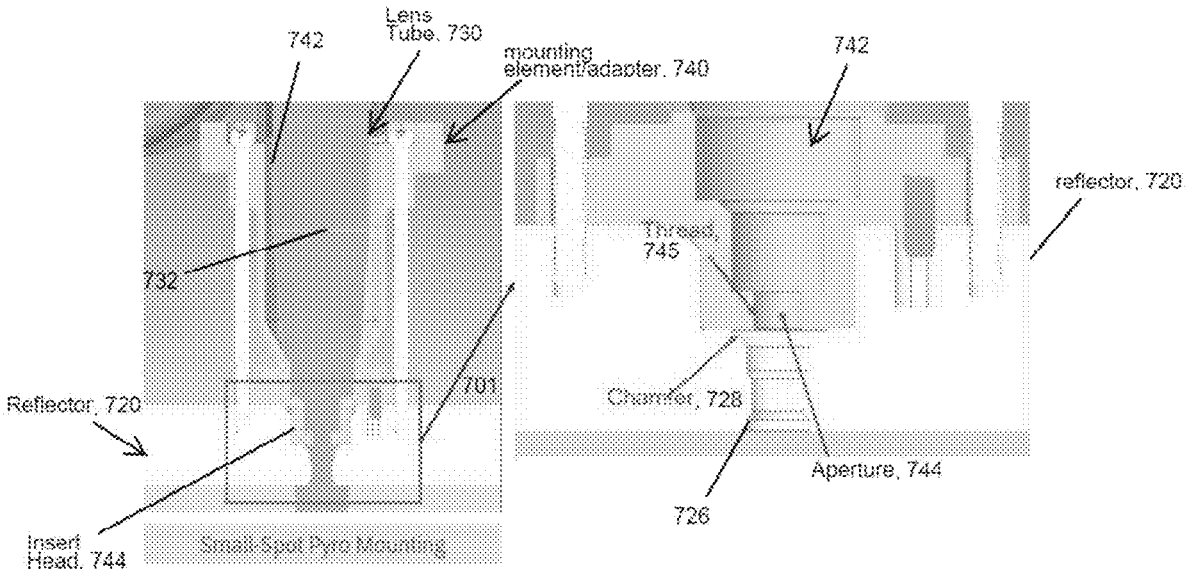
FIG. 7 is a side sectional view of an edge view pyrometer portion of a temperature monitoring assembly illustrating mounting to monitor a smaller spot size.

FIG. 7 is a side sectional view of an edge view pyrometer portion of a temperature monitoring assembly illustrating mounting to provide a smaller spot size, with an enlarged view shown at 701. As shown, a pyrometer is mounted to a top surface of a reflector 720 using a mounting stand 740, and a lens tube 730 of the pyrometer is received in an inner passageway or chamber 742 to end with its outlet 732 a distance from the top surface of the reflector 720. Its received energy is transmitted into the bottom of the chamber/passageway 742 via a transmission channel in 726 in the reflector 720 from a top surface of a substrate (not shown in FIG. 7 but understood from the reactor system 100 of FIG. 1).

The chamber/passageway 742 may have a circular cross sectional shape matching the lens tube 730 at the upper portion in which the tube 730 is received. The outer diameter may be stepped down to, in part, achieve the smaller spot size from the lens tube 730. In the specific embodiment shown in FIG. 7, the mounting stand 740 includes an aperture (or chamber outlet) 744 that is stepped down from the outer diameter/dimensions of the lens tube 730 to an outer diameter of or near the desired spot size (e.g., about 2 to about 10 millimeters with about 4 to about 8 millimeters being more preferred and about 6 millimeters used in one exemplary implementation).

A chamfer 728 in the reflector inlet to the transmission channel 726 along with a thread 745 in the aperture 744 may be added for provide a small-field of view (or spot/sensor area size) pyrometer to reduce stray light with minimal hardware risk. This may be desirable to minimize or control stray light or noise that could impact a pyrometer reading with the edge pyrometer. Most unwanted noise projected on the side wall of the pyrometer mounting stand 740 can be reflected back or absorbed by the mounting stand 740 instead of going into the pyrometer lens/lens tube 730.

Figure 8:
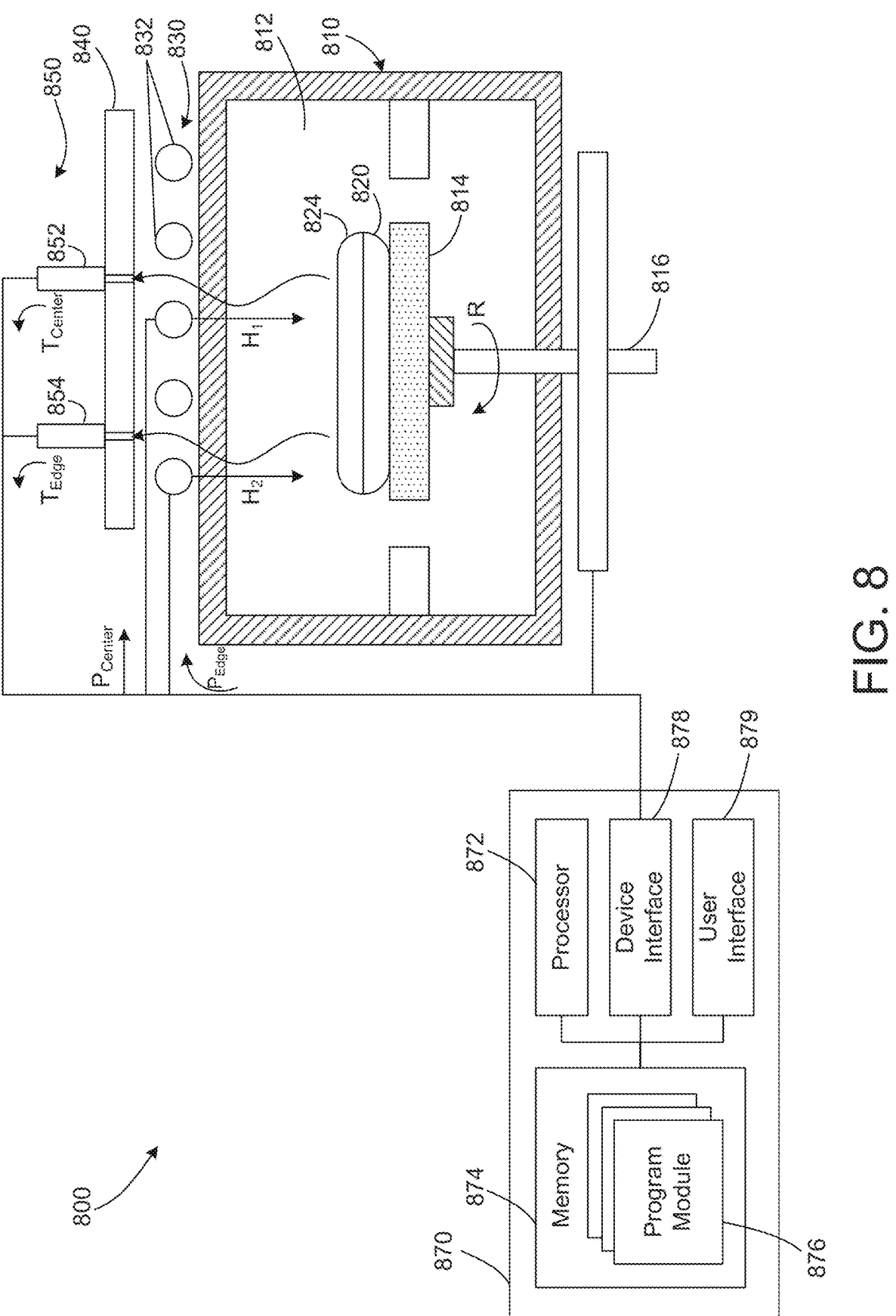
FIG. 8 is a functional block diagram of a reactor system of the present description.

FIG. 8 is a functional block diagram of a reactor system 800 with dual-zone temperature monitoring and control. The reactor system 800 may take a variety of forms to utilize such monitoring and control and is shown in simplified form with a reactor chamber 810 with an interior space or volume 812 in which a susceptor or substrate support 814 is provided that can be rotated, as shown by arrow R, by rotation mechanism 816. A substrate 820 may be provided upon the susceptor 814 and a film 824 may be deposited or grown during operations of the system 800. For example, the system 800 and chamber 810 may be configured for a multitude of deposition processes, including but not limited to, ALD, CVD, metalorganic chemical vapor deposition (MOCVD), molecular beam epitaxy (MBE), and physical vapor deposition (PVD).

An array 830 of heat or thermal generators (e.g., heat lamps) 832 is positioned above the chamber 810 and provides heat to the susceptor 814 and any substrate 820 and film 824 thereon, and this may be controlled by operating the heat generators 832 in dual zones as shown with arrows $H_1$ and $H_2$ (e.g., a center zone or group of generators 832 and an edge zone or group of generators 832).

To monitor the substrate 820 and film 824 temperatures during operations of the generators 832 in array 830, the system 800 includes a dual-zone temperature monitoring assembly 850 that includes a center zone pyrometer 852 and an edge zone pyrometer 854 that sense temperatures in areas or spots on the substrate 820 and/or film 824. This monitoring can be achieved via reflected energy or radiation, as shown by wavy lines, that passes through gaps in a reflector 840 upon which the pyrometers 852, 854 are mounted.

A controller 870 is provided in the system for generating control signals (e.g., proportional power outputs) $P_{Center}$ and $P_{Edge}$ for independently controlling the heat generators 832 in the center or first zones based on sensed temperatures of the substrate 820 and/or film 824 during deposition processes. To this end, the temperature information or pyrometer temperature outputs, $T_{Center}$ and $T_{Edge}$ are communicated to the controller for processing and, in response, generating the control outputs $P_{Center}$ and $P_{Edge}$. The controller 870 includes a processor 872 that manages memory 874 of the controller 870 (or accessible by controller 870), and software or executable instructions or code 876 may be executed by the processor to provide the dual-zone temperature monitoring and control functions described herein (e.g., PID control with control outputs $P_{Center}$ and $P_{Edge}$ of the array 830 of heat generators 832).

The controller 870 may further include a user interface 879 for facilitating an operator selecting between control or program modules 876, interacting with monitored temperature data, modifying or updating deposition or processing parameters, and the like. The user interface 879, to this end, may include a graphical user interface (GUI) generated by the processor 872 based on a GUI generator module 876 that may be displayed on a monitor, touchscreen, or the lie. A device interface 878 may be provided in the controller 870 with one or more input/output (I/O) components to facilitate wired or wireless communications between the controller

870 and the temperature sensors 852, 874 and/or the individual heat generators 832 (or their controllers/drivers) of the array 830.

Figure 9:
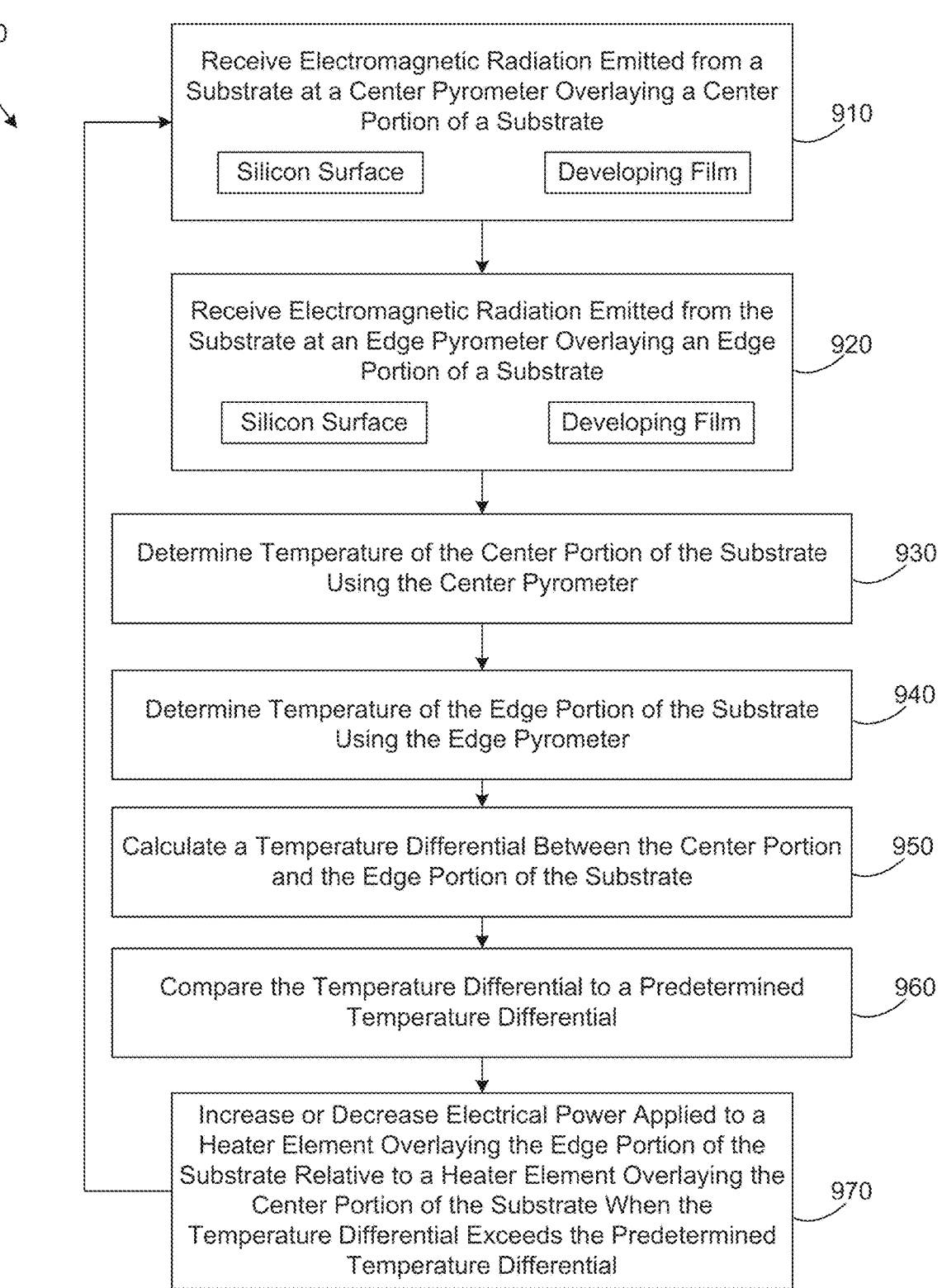
FIG. 9 is a method of using the dual zone temperature monitoring to control temperatures within a reaction or processing chamber of a reactor system, such as in the system of FIG. 8.

FIG. 9 is a method 900 of using the dual zone temperature monitoring to control temperatures within a reaction or processing chamber of a reactor system, such as in the system 800 of FIG. 8 with its controller 870 using the processor 872 and program modules 876 to perform one or more steps of the method 900. The method 900 may start with providing a substrate, such as one with a silicon surface, in a reaction chamber with a dual-zone temperature monitoring assembly as described herein. The reaction chamber may then be used to perform deposition processes that provides a developing film.

Then, at step 910, the method 900 may include receiving electromagnetic radiation with a first or center pyrometer. This radiation is emitted from the substrate, and the center pyrometer is positioned relative to the substrate (and its support) and the reaction chamber to overlay a center portion of the substrate. At step 920, the method 900 may include receiving electromagnetic radiation with a second or edge pyrometer. This radiation is also emitted from the substrate, and the second or edge pyrometer is positioned relative to the substrate (and its support) and the reaction chamber to overlay an edge portion of the substrate.

The method 900 continues with steps 930 and 940 with processing outputs of the center and edge pyrometers to determine a temperature of the center portion of the substrate and a temperature of the edge portion of the substrate using the center and edge pyrometers. Then, at step 950, the method 900 involves calculating a temperature differential between the center portion and the edge portion of the substrate using these two determined temperatures. The method 900 then continues at step 960 with comparing the temperature differential calculated in step 950 with a predetermined temperature differential (e.g., a temperature differential (or range of acceptable differentials) established via testing or experimentation for the process presently occurring in the reaction chamber and stored in memory such as in memory 874 for access by processor 872). Then, at step 970, the method 900 involves increasing or decreasing electrical power applied to a heater element or heat generator overlaying the edge portion of the substrate relative to a heater element or heat generator overlaying the center portion of the substrate when the temperature differential exceeds the predetermined temperature differential (based on the comparison performed in step 960).

In certain examples, the method 900 may be employed during the deposition of a film stack. The film stack may include alternating layers having different compositions, such as alternating layers of silicon germanium films and silicon films overlaying one another. In certain examples, the silicon germanium layers and silicon layers may be deposited in an isothermal and an isobaric temperature regime, i.e., the silicon germanium layers and silicon layers deposited at common deposition temperature and a common pressure, the above-described temperature control system and method being employed during deposition of the silicon germanium layers and the silicon layers. As will be appreciated by those of skill in the art in view of the present disclosure, employment of an isothermal and isobaric deposition process reduces (or eliminates) the need for stabilization time between deposition of succeeding layers.

In accordance with certain examples, the method 900 may be employed in a non-isothermal and/or a non-isobaric deposition process. For example, during the deposition of a silicon germanium/silicon film stack, silicon germanium layers may be deposited using a silicon germanium deposition temperature between about 550 degrees Celsius and 700 degrees Celsius, and/or a silicon germanium deposition pressure between about 5 torr and about 20 torr, and silicon layers may be deposited at a different temperature within a range of about 650 degrees Celsius and about 780 degrees Celsius, and/or at a different silicon deposition pressure between about 10 torr and about 80 torr. Advantageously, and contrary to expectations, little (and in certain examples substantially none) increase in stabilization time is necessary using the method 900 due to the employment of real-time temperature measurements of the substrate in relation to deposition regimes employing indirect temperature measurements.

Benefits, other advantages, and solutions to problems have been described herein with regard to specific embodiments. However, the benefits, advantages, solutions to problems, and any elements that may cause any benefit, advantage, or solution to occur or become more pronounced are not to be construed as critical, required, or essential features or elements of the disclosure.

Reference throughout this specification to features, advantages, or similar language does not imply that all of the features and advantages that may be realized with the present disclosure should be or are in any single embodiment of the invention. Rather, language referring to the features and advantages is understood to mean that a specific feature, advantage, or characteristic described in connection with an embodiment is included in at least one embodiment of the subject matter disclosed herein. Thus, discussion of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize that the subject matter of the present application may be practiced without one or more of the specific features or advantages of a particular embodiment. In other instances, additional features and advantages may be recognized in certain embodiments that may not be present in all embodiments of the disclosure. Further, in some instances, well-known structures, materials, or operations are not shown or described in detail to avoid obscuring aspects of the subject matter of the present disclosure. No claim element is intended to invoke 35 U.S.C. 112(f) unless the element is expressly recited using the phrase "means for."

The scope of the disclosure is to be limited by nothing other than the appended claims, in which reference to an element in the singular is not intended to mean "one and only one" unless explicitly so stated, but rather "one or more." It is to be understood that unless specifically stated otherwise, references to "a," "an," and/or "the" may include one or more than one and that reference to an item in the singular may also include the item in the plural. Further, the term "plurality" can be defined as "at least two." As used herein, the phrase "at least one of", when used with a list of items, means different combinations of one or more of the listed items may be used and only one of the items in the list may be needed. The item may be a particular object, thing, or category. Moreover, where a phrase similar to "at least one of A, B, and C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A, B, and C. In some cases, "at least one of item A, item B, and item C" may mean, for example, without limitation, two of item A, one of item B, and ten of item C; four of item B and seven of item C; or some other suitable combination.

All ranges and ratio limits disclosed herein may be combined. Unless otherwise indicated, the terms "first," "second," etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

Any reference to attached, fixed, connected or the like may include permanent, removable, temporary, partial, full and/or any other possible attachment option. Additionally, any reference to without contact (or similar phrases) may also include reduced contact or minimal contact. In the above description, certain terms may be used such as "up," "down," "upper," "lower," "horizontal," "vertical," "left," "right," and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object.

Additionally, instances in this specification where one element is "coupled" to another element can include direct and indirect coupling. Direct coupling can be defined as one element coupled to and in some contact with another element. Indirect coupling can be defined as coupling between two elements not in direct contact with each other, but having one or more additional elements between the coupled elements. Further, as used herein, securing one element to another element can include direct securing and indirect securing. Additionally, as used herein, "adjacent" does not necessarily denote contact. For example, one element can be adjacent another element without being in contact with that element.

Although exemplary embodiments of the present disclosure are set forth herein, it should be appreciated that the disclosure is not so limited. For example, although reactor systems are described in connection with various specific configurations, the disclosure is not necessarily limited to these examples. Various modifications, variations, and enhancements of the system and method set forth herein may be made without departing from the spirit and scope of the present disclosure.

The subject matter of the present disclosure includes all novel and nonobvious combinations and subcombinations of the various systems, components, and configurations, and other features, functions, acts, and/or properties disclosed herein, as well as any and all equivalents thereof.

What is claimed is:

1. A reactor system for providing zone-based substrate temperature control, comprising:
a reaction chamber;
in the reaction chamber, a susceptor for supporting a substrate;
a plurality of heat generators operable to heat the substrate on the susceptor;
a temperature monitoring assembly comprising first and second pyrometers reading temperatures in a center zone and an edge zone of the substrate;

a controller controlling a first set of the heat generators based on the temperature of the center zone and a second set of the heat generators differing from the first set based on the temperature of the edge zone; and
a reflector, wherein the second pyrometer is attached to an upper surface of the reflector with a mounting stand, wherein the reflector comprises a transmission channel, and wherein the mounting stand comprises a chamber for receiving a lens tube of the second pyrometer, whereby energy received by the second pyrometer is directed through the chamber and the transmission channel onto the substrate supported on the susceptor.

2. The reactor system of claim 1, wherein the heat generators each comprises a heat lamp and wherein the controller controls operations of the heat generators by directing first and second levels of electric power to the heat generators of the first and second sets based on a comparison of the temperatures of the center and edge zones sensed by the first and second pyrometers to predefined temperature setpoints for the center and edge zones.

3. The reactor system of claim 2, wherein the controller is configured to independently provide proportional-integral-derivative (PID) control to the heat generators of the first and second sets based on ongoing feedback from the first and second pyrometers.

4. The reactor system of claim 1, wherein the second pyrometer monitors temperatures in a sensor spot on the substrate with an outer diameter in the range of 1 to 15 mm.

5. The reactor system of claim 4, wherein the sensor spot has an outer diameter in the range of 4 to 8 mm that is centered at a radial offset from the edge of the substrate in the range of 4 to 10 mm.

6. The reactor system of claim 1, wherein the susceptor is supported within the reaction chamber for rotation about a rotation axis, wherein the first pyrometer has a first sensor spot, wherein the second pyrometer has a second sensor spot, and wherein the rotation axis is between the first sensor spot and the second sensor spot.

7. The reactor system of claim 6, wherein the reactor is configured to flow a precursor over the substrate in a flow direction orthogonal relative to the rotation axis, wherein the second sensor spot is upstream of the first sensor spot relative to the flow direction of the precursor over the substrate.

8. The reactor system of claim 6, wherein the reactor is configured to flow a precursor over the substrate in a flow direction orthogonal relative to the rotation axis, wherein the first sensor spot and the second sensor spot are on laterally opposite sides of the flow direction of the precursor over the substrate.

9. A reactor system for providing real-time substrate temperature variation control, comprising:
a plurality of heat lamps operable to heat a substrate supported upon a susceptor;
a temperature monitoring assembly comprising a center pyrometer and an edge pyrometer for sensing, respectively, a temperature in a center zone of the substrate and a temperature in an edge zone of the substrate;
a controller operating the plurality of heat lamps based on a comparison of the temperatures of the center and edge zones to temperatures setpoints for the center and edge zones, wherein during the operating the controller generates control signals to independently operate a first set of the heat lamps to heat the center zone of the substrate and a second set of the heat lamps, differing from the first set, to heat the edge zone of the substrate; and a reflector, wherein the edge pyrometer is attached to an upper surface of the reflector with a mounting stand, wherein the reflector comprises a transmission channel, wherein the mounting stand comprises a chamber for receiving a lens tube of the edge pyrometer, whereby energy received by the edge pyrometer is directed through the chamber and the transmission channel from the substrate supported on the susceptor.

10. The reactor system of claim 9, wherein the control signals are configured to proportionally set amounts of electric power provided to the first and second sets of the heat lamps.

11. The reactor system of claim 10, wherein the controller is configured to independently provide proportional-integral-derivative (PID) control to each of the first and second sets of the heat lamps.

12. The reactor system of claim 10, wherein the edge pyrometer monitors a sensor spot on the substrate with an outer diameter in the range of 1 to 15 mm.

13. The reactor system of claim 12, wherein the sensor spot is centered at a radial offset from the edge of the substrate in the range of 4 to 10 mm.

14. The reactor system of claim 9, wherein the susceptor is supported for rotation about a rotation axis, wherein the center zone is offset from the rotation axis, and wherein the rotation axis separates the edge zone from the center zone.

\* \* \* \* \*